(12) United States Patent
King et al.

(10) Patent No.: US 10,790,749 B2
(45) Date of Patent: Sep. 29, 2020

(54) SWITCHED-MODE POWER SUPPLY WITH ENERGY STORAGE

(71) Applicant: Cirrus Logic International Semiconductor Ltd., Edinburgh (GB)

(72) Inventors: Eric J. King, Austin, TX (US); Eric B. Smith, Austin, TX (US); Mark May, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 116 days.

(21) Appl. No.: 15/783,744

(22) Filed: Oct. 13, 2017

(65) Prior Publication Data

US 2019/0013735 A1 Jan. 10, 2019

Related U.S. Application Data

(60) Provisional application No. 62/529,058, filed on Jul. 6, 2017, provisional application No. 62/529,154, filed on Jul. 6, 2017, provisional application No. 62/529,882, filed on Jul. 7, 2017, provisional application No. 62/532,055, filed on Jul. 13, 2017, provisional application No. 62/537,200, filed on Jul. 26, 2017.

(51) Int. Cl.
*H02M 3/158* (2006.01)
*H03F 1/02* (2006.01)
*H02M 3/156* (2006.01)

(52) U.S. Cl.
CPC ........ *H02M 3/1584* (2013.01); *H03F 1/0227* (2013.01); *H02M 2003/1566* (2013.01)

(58) Field of Classification Search
CPC ..... H02M 2001/0067–0096; H02M 2001/009; H02M 3/1584; H02M 2003/1566; H03F 1/0227
See application file for complete search history.

(56) References Cited

U.S. PATENT DOCUMENTS

| 2014/0232458 | A1* | 8/2014 | Arno ...................... H03F 3/189 330/127 |
| 2015/0256106 | A1* | 9/2015 | Yuan ................... H02M 7/5387 363/132 |
| 2017/0054298 | A1* | 2/2017 | Fu .......................... H02M 7/487 |
| 2017/0294831 | A1* | 10/2017 | Dai ............................ G05F 5/00 |
| 2018/0138815 | A1* | 5/2018 | Yamada ................ H02M 3/158 |

\* cited by examiner

*Primary Examiner* — Thienvu V Tran
*Assistant Examiner* — Peter M Novak
(74) *Attorney, Agent, or Firm* — Jackson Walker L.L.P.

(57) ABSTRACT

A system may include a first capacitor, a first switched-mode power supply configured to deliver energy from a power source to the first capacitor at an output load of the first switched-mode power supply, a second capacitor having a capacitance larger than the first capacitor, a second switched-mode power supply configured to deliver energy from the power source or a second power source to the second capacitor and one or more switching elements coupled between the first capacitor and the second capacitor. The system may operate in a plurality of modes, including a first mode in which the first switched-mode power supply transfers energy to the first capacitor and the second capacitor, a second mode in which the second capacitor transfers energy to the first capacitor, and a third mode in which first switched-mode power supply transfers energy to the first capacitor and the second capacitor and the second switched-mode power supply transfers energy to the first capacitor and the second capacitor.

36 Claims, 5 Drawing Sheets

SWITCHED-MODE POWER SUPPLY WITH ENERGY STORAGE

RELATED APPLICATIONS

The present disclosure claims priority to U.S. Provisional Patent Application Ser. No. 62/529,058, filed Jul. 6, 2017, U.S. Provisional Patent Application Ser. No. 62/529,154, filed Jul. 6, 2017, U.S. Provisional Patent Application Ser. No. 62/529,882, filed Jul. 7, 2017, U.S. Provisional Patent Application Ser. No. 62/532,055, filed Jul. 13, 2017, and U.S. Provisional Patent Application Ser. No. 62/537,200, filed Jul. 26, 2017, all of which are incorporated by reference herein in its entirety.

FIELD OF DISCLOSURE

The present disclosure relates in general to circuits for audio devices, including without limitation personal audio devices such as wireless telephones and media players, and more specifically, to a switched mode power supply for supplying a supply voltage to an amplifier or other load.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude. Although many amplifier architectures (e.g., Class A, Class B, and Class AB amplifiers) provide for only a single power supply for a power amplifier, some architectures provide for at least two supply voltages for powering a power amplifier, in order to achieve greater power efficiency over single or constant power supply voltage architectures.

One example of a multi-supply voltage amplifier is a Class H amplifier. A Class H amplifier may have an infinitely variable voltage supply rail that tracks an envelope of an output signal of the Class H amplifier. In order to provide such an infinitely variable voltage supply rail, the output supply rail may be modulated such that the rail is only slightly larger than a magnitude of the audio output signal at any given time. For example, switched-mode power supplies may be used to create the output signal-tracking voltage rails. Accordingly, a Class H amplifier may increase efficiency by reducing the wasted power at output driving transistors of the amplifier.

In many portable audio systems, boosted amplifiers are often used to deliver a larger voltage swing to an output headphone or speaker than is available from a battery. In order to obtain these larger voltage swings on an output, a boost converter is typically placed such that its output charges a storage capacitor which provides a supply voltage to an amplifier driving the output. One potential problem that arises in playing back music to an audio output device (e.g., speaker or headphone) is a large crest factor of musical material. Due to this crest factor, peak power delivery to the output device may be many times larger (e.g., six to 10 decibels larger) than an average power of the musical material. Thus, the crest factor may place high current demands on the battery.

One way to mitigate peak power demands as seen by a battery is to oversize the storage capacitor of the boost converter. By doing so, an input current of a boost converter may be limited to a maximum value. During the period of input current limiting, stored energy from the oversized storage capacitor may be used to provide the peak power demand of the amplifier. However, an issue created when using a large storage capacitor is an increase in time or current required to alter the voltage on the capacitor, which may reduce or eliminate a boost converter's ability to perform as a Class-H amplifier.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a system may include a first capacitor having a first capacitance, a first switched-mode power supply configured to deliver electrical energy from a power source to the first capacitor at an output load of the first switched-mode power supply, a second capacitor having a second capacitance larger than the first capacitance, a second switched-mode power supply configured to deliver electrical energy from the power source or a second power source to the second capacitor and one or more switching elements coupled between the first capacitor and the second capacitor. The system may be configured to operate in a plurality of modes, including a first mode in which the first switched-mode power supply transfers energy to the first capacitor and the second capacitor, a second mode in which the first capacitor and the second capacitor are decoupled from each other, and a third mode in which first switched-mode power supply transfers energy to the first capacitor and the second capacitor and the second switched-mode power supply transfers energy to the first capacitor and the second capacitor.

In accordance with these and other embodiments of the present disclosure, a method may, in a system comprising a first capacitor having a first capacitance, a first switched-mode power supply configured to deliver electrical energy from a power source to the first capacitor at an output load of the first switched-mode power supply, a second capacitor having a second capacitance larger than the first capacitance, and a second switched-mode power supply, a second switched-mode power supply configured to deliver electrical energy from the power source or a second power source to the second capacitor, controlling one or more switching elements coupled between the first capacitor and the second capacitor. The method may also include operating the system in a plurality of modes, including a first mode in which the first switched-mode power supply transfers energy to the first capacitor and the second capacitor, a second mode in which the first capacitor and the second capacitor are decoupled from each other, and a third mode in which first switched-mode power supply transfers energy to the first capacitor and the second capacitor and the second switched-mode power supply transfers energy to the first capacitor and the second capacitor.

In accordance with these and other embodiments of the present disclosure, a system comprising may include a first capacitor having a first capacitance, a second capacitor having a second capacitance larger than the first capacitance, and a plurality of switched-mode power supplies configured to deliver electrical energy from one or more power sources to the first capacitor and the second capacitor in accordance with operation in a plurality of modes including a first mode of operation in which the plurality of switched-mode power supplies transfers electrical energy to the first capacitor and the second capacitor in a phase-interleaved fashion and a second mode of operation in which the first capacitor and the second capacitor are electrically decoupled from one another, one of the plurality of switched-mode power supplies transfers electrical energy to the second capacitor and the remainder of the plurality of switched-mode supplies power transfer electrical energy to the first capacitor in a phase-interleaved fashion.

In accordance with these and other embodiments of the present disclosure, a method may include, in a system comprising a first capacitor having a first capacitance, a second capacitor having a second capacitance larger than the first capacitance, and a plurality of switched-mode power supplies configured to deliver electrical energy from one or more power sources to the first capacitor and the second capacitor, operating the system in a plurality of modes including a first mode of operation in which the plurality of switched-mode power supplies transfers electrical energy to the first capacitor and the second capacitor in a phase-interleaved fashion and a second mode of operation in which the first capacitor and the second capacitor are electrically decoupled from one another, one of the plurality of switched-mode power supplies transfers electrical energy to the second capacitor and the remainder of the plurality of switched-mode supplies power transfer electrical energy to the first capacitor in a phase-interleaved fashion.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
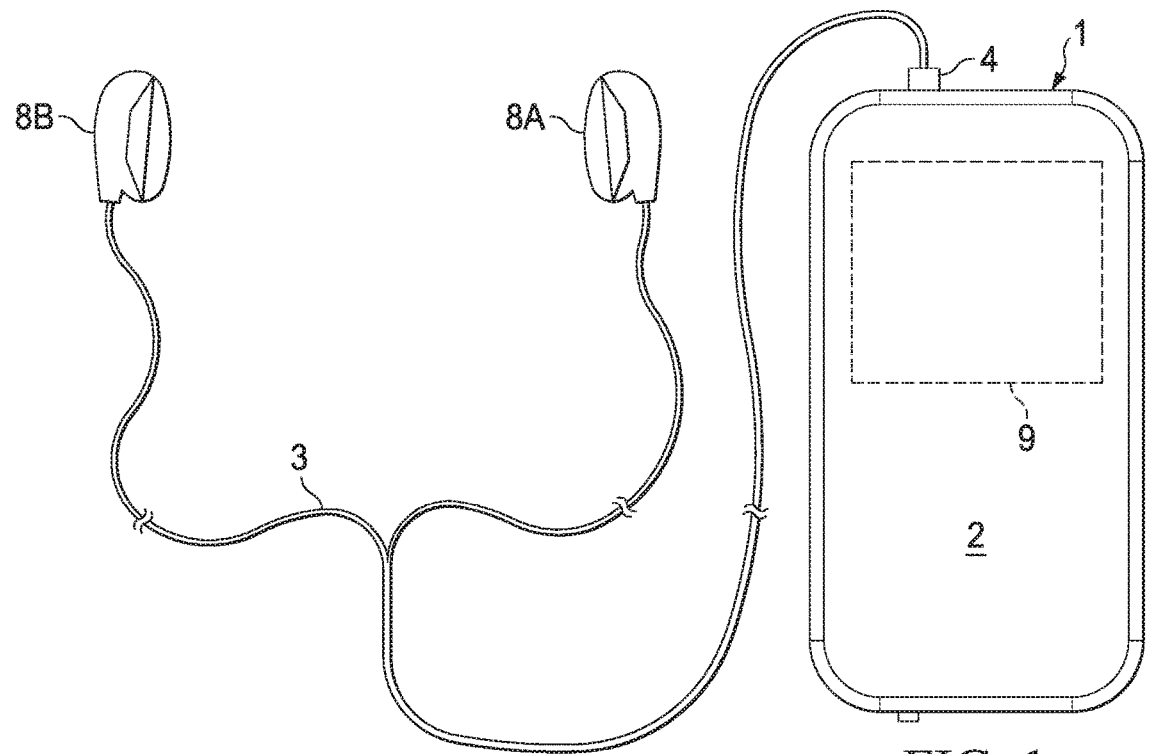
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
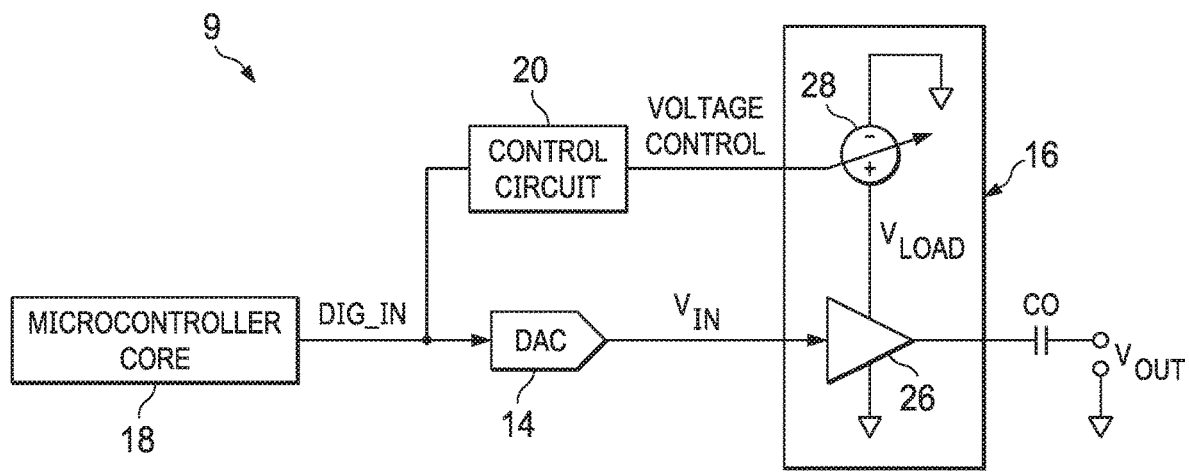
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier stage 16 which may amplify or attenuate audio input signal $V_{IN}$ to provide an audio output signal $V_{OUT}$, which may operate a speaker, headphone transducer, a line level signal output, and/or other suitable output. A capacitor CO may be utilized to couple the output signal to the transducer or line level output, particularly if amplifier stage 16 is operated from a unipolar power supply having a quiescent voltage substantially differing from ground. Also, as shown in FIG. 2, audio IC 9 may include a control circuit 20 configured to, based on digital audio input signal DIG_IN, control a power supply voltage of amplifier stage 16 using one or more control signals (labeled as "VOLTAGE CONTROL" in FIG. 2).

As depicted in FIG. 2, amplifier stage 16 may include a Class H amplifier 26 which has an input for receiving analog signal $V_{IN}$, an output for generating output signal $V_{OUT}$ based on and indicative of analog signal $V_{IN}$, and a power supply input for receiving a variable load voltage $V_{LOAD}$ output by a variable power supply 28, wherein variable power supply 28 outputs variable load voltage $V_{LOAD}$ based on one or more control signals VOLTAGE CONTROL. Load voltage $V_{LOAD}$ output by variable power supply 28 may be selected from a plurality of discrete voltages, or may include an infinite number of voltages between a minimum and maximum voltage.

Figure 3:
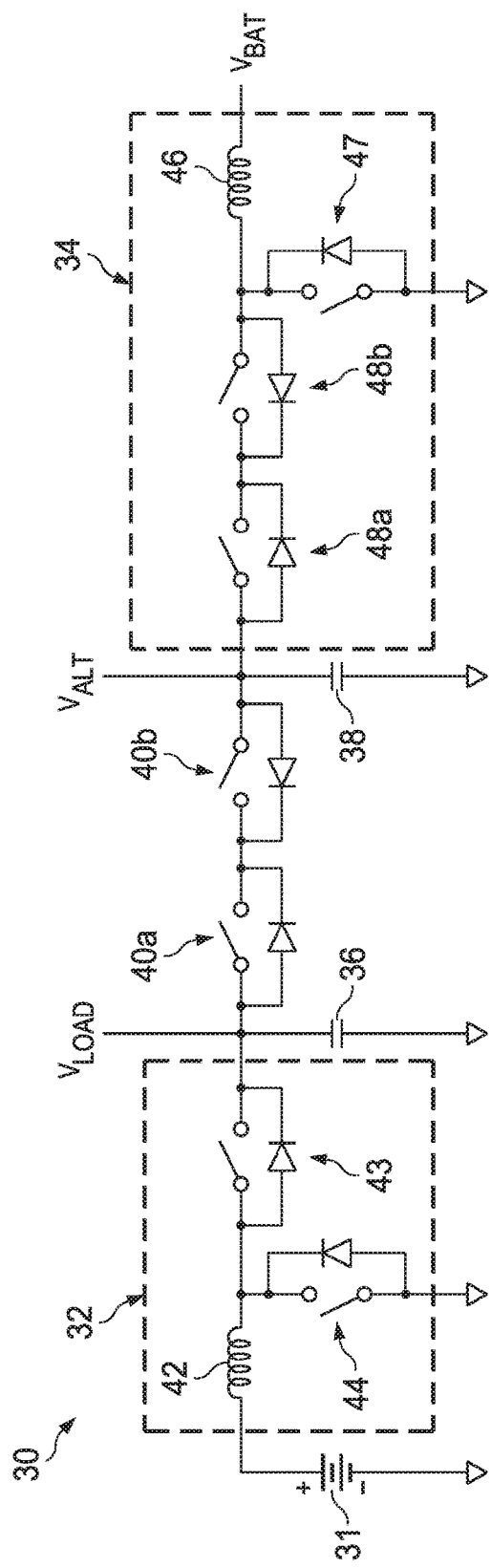
FIG. 3 is a block diagram of selected components of an example system for generating a boosted voltage, in accordance with embodiments of the present disclosure.

FIG. 3 is a block diagram of selected components of an example system 30 for generating a boosted voltage, in accordance with embodiments of the present disclosure. In some embodiments, example system 30 may be used to implement variable power supply 28 of FIG. 2. As shown in FIG. 3, system 30 may include a battery 31 or other voltage source configured to output a battery voltage $V_{BAT}$. Battery 31 may comprise any suitable energy storage device, including without limitation one or more electrochemical cells configured to convert chemical energy into electrical energy at the terminals of battery 31. As shown in FIG. 3, system 30 may also include an output at which system 30 may generate a single-ended load voltage $V_{LOAD}$.

As also depicted in FIG. 3, system 30 may include a first switched-mode power supply 32, a second switched-mode power supply 34, a first capacitor 36, a second capacitor 38, and one or more switching elements 40 (e.g., switching elements 40a, 40b) coupled between first capacitor 36 and second capacitor 38.

First switched-mode power supply 32 may comprise a power inductor 42 and a plurality of switches 43 and 44. Power inductor 42 may comprise any passive two-terminal electrical component which resists changes in electrical current passing through it and such that when electrical current flowing through it changes, a time-varying magnetic field induces a voltage in power inductor 42, in accordance with Faraday's law of electromagnetic induction, which opposes the change in current that created the magnetic field. As shown in FIG. 3, power inductor 42 may be coupled between a positive input terminal of battery 31 at a first terminal of power inductor 42 and a switching node at a second terminal of power inductor 42 to which switches 43 and 44 are coupled.

Each switch 43 and 44 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 43 and 44 (e.g., control signals communicated from control circuit 20) are not depicted although such control signals would be present to selectively enable and disable switches 43 and 44. In some embodiments, a switch 43, 44 may comprise an n-type metal-oxide-semiconductor field-effect transistor.

Switch 43 may be coupled between the second terminal of power inductor 42 and an output of first switched-mode power supply 32. Switch 44 may be coupled between the second terminal of power inductor 42 and a negative input terminal of battery 31 (e.g., a ground voltage). In operation, switches 43 and 44 may be controlled by control circuit 20 such that first switched-mode power supply 32 operates as a boost converter such that first switched-mode power supply 32 generates its output voltage (e.g., load voltage $V_{LOAD}$) greater than its input power supply voltage (e.g., battery voltage $V_{BAT}$). For example, control circuit 20 may sequentially commutate switches 43 and 44 in a charging phase and discharging phase, respectively, in order to operate as a boost converter.

First capacitor 36 may be coupled at its first terminal to the output of first switched-mode power supply 32 and at its second terminal to the negative input terminal of battery 31 (e.g., ground voltage). First capacitor 36 may comprise any electrical component used to temporarily store electrical energy in an electric field. In some embodiments, first capacitor 36 may be replaced with any other component capable of storing energy. In operation in system 30, first capacitor 36 may store energy transferred from battery 31 by first switched-mode power supply 32, thus providing load voltage $V_{LOAD}$ as a supply voltage (e.g., to amplifier 16).

Second switched-mode power supply 34 may comprise a power inductor 46 and a plurality of switches 47 and 48 (e.g., wherein switch 48 comprises switching elements 48a and 48b). Power inductor 46 may comprise any passive two-terminal electrical component which resists changes in electrical current passing through it and such that when electrical current flowing through it changes, a time-varying magnetic field induces a voltage in power inductor 46, in accordance with Faraday's law of electromagnetic induction, which opposes the change in current that created the magnetic field. As shown in FIG. 3, power inductor 46 may be coupled between a positive input terminal of battery 31 at a first terminal of power inductor 46 and a switching node at a second terminal of power inductor 46 to which switches 47 and 48 are coupled.

Each switch 47 and 48 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 47 and 48 (e.g., control signals communicated from control circuit 20) are not depicted although such control signals would be present to selectively enable and disable switches 47 and 48. In some embodiments, a switch 47, 48 may comprise an n-type metal-oxide-semiconductor field-effect transistor. In these and other embodiments, switch 48 may comprise two switching elements 48a and 48b having opposing body diodes (e.g., cathodes of such body diodes are electrically-coupled together).

Switch 47 may be coupled between the second terminal of power inductor 46 and a negative input terminal of battery 31 (e.g., a ground voltage). Switch 48 may be coupled between the second terminal of power inductor 46 and an output of second switched-mode power supply 34. In operation, switches 47 and 48 may be controlled by control circuit 20 such that second switched-mode power supply 34 operates as a boost converter such that second switched-mode power supply 34 generates its output voltage (e.g., alternate voltage $V_{ALT}$) greater than its input power supply voltage (e.g., battery voltage $V_{BAT}$). For example, control circuit 20 may sequentially commutate switches 47 and 48 in a charging phase and discharging phase, respectively, in order to operate as a boost converter.

Second capacitor 38 may be coupled at its first terminal to the output of second switched-mode power supply 34 and at its second terminal to the negative input terminal of battery 31 (e.g., ground voltage). Second capacitor 38 may comprise any electrical component used to temporarily store electrical energy in an electric field. In some embodiments, second capacitor 38 may be replaced with any other component capable of storing energy. In operation in system 30, second capacitor 38 may store energy transferred from battery 31 by first switched-mode power supply 34, thus providing alternate voltage $V_{ALT}$ which may be used as further described herein.

Each switching element 40a and 40b may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switching elements 40a and 40b (e.g., control signals communicated from control circuit 20) are not depicted although such control signals would be present to selectively enable and disable switching elements 40a and 40b. In some embodiments, a switching element 40a, 40b may comprise an n-type metal-oxide-semiconductor field-effect transistor. In these and other embodiments, switching elements 40a and 40b may have opposing body diodes (e.g., cathodes of such body diodes are electrically-coupled together). In these and other embodiments, switching elements 40a and 40b may be controlled to be enabled and disabled together, thus effectively acting as a single switch.

In some embodiments, second capacitor 38 may have a capacitance larger than that of first capacitor 36. In these and other embodiments, the physical sizes of switches 47 and 48 may be smaller than that of switches 43 and 44. In these and other embodiments, the physical size and inductance of power inductor 46 may be smaller than that of power inductor 42.

In addition, although FIG. 3 depicts second switched-mode power supply 34 receiving energy from the same battery 31 as first switched-mode power supply 32, in some embodiments, a different battery or power source may provide electrical energy to second-switched mode power supply 34.

In operation, system 30 may operate as a variable power supply, providing a variable load voltage $V_{LOAD}$ (e.g., to an amplifier 16), thus allowing amplifier 16 to operate as a Class-H amplifier. For example, assuming switching elements 40a and 40b are disabled, control circuit 20 may control relative durations in which switch 43 and switch 44 are enabled and disabled during switching cycles of first switched-mode power supply 32, in order to control load voltage $V_{LOAD}$ (e.g., responsive to an expected magnitude of output voltage $V_{OUT}$ of amplifier 16). However, to reduce or eliminate one or more problems addressed in the Background section of this application, second switched-mode power supply 34 may, when enabled in a maintenance mode (as described in greater detail below), generate alternate voltage $V_{ALT}$ and maintain alternate voltage $V_{ALT}$ at a maximum voltage $V_{MAX}$.

Figure 4:
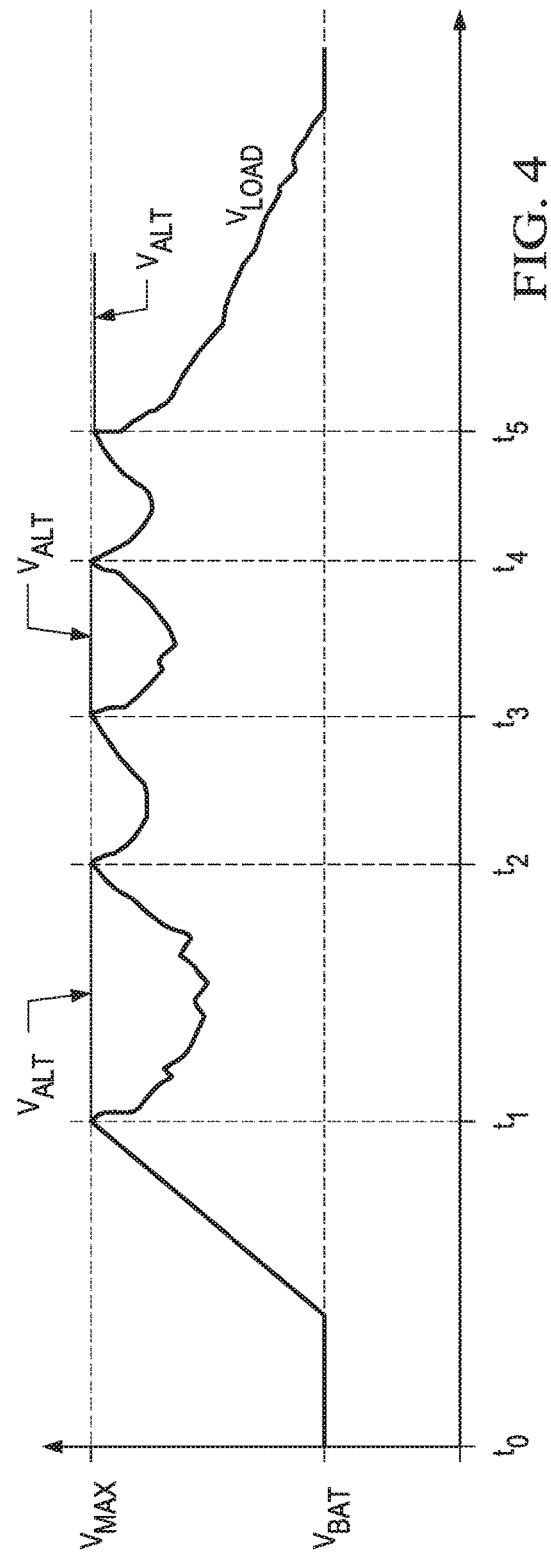
FIG. 4 illustrates a graph of an example load voltage and an example alternate voltage associated with the system depicted in FIG. 3, in accordance with embodiments of the present disclosure.

To further illustrate, system 30 may operate in a plurality of modes, including at least a first mode, a second mode, a third mode, and a fourth mode. In the first mode, switching elements 40a and 40b may be enabled, and second switched-mode power supply 34 may be disabled (e.g., control circuit 20 may disable switch 48 and/or cease commutation of switches 47 and 48), such that first switched-mode power supply 32 transfers energy from battery 31 to both of first capacitor 36 and second capacitor 38, thus increasing load voltage $V_{LOAD}$ and alternate voltage $V_{ALT}$. In FIG. 4, which depicts example plots of load voltage $V_{LOAD}$ and alternate voltage $V_{ALT}$ versus time, the first mode is shown between times $t_0$ and $t_1$.

In the second mode, switching elements 40a and 40b may be disabled, such that first capacitor 36 and second capacitor 38 are decoupled from one another. Thus, in the second mode, first switched-mode power supply 32 may transfer energy from battery 31 to first capacitor 36 to generate a desired load voltage $V_{LOAD}$. In addition, during the second mode, second switched-mode power supply 34 may be enabled and operate in maintenance mode, whereby it transfers energy from battery 31 to second capacitor 38 to maintain alternate voltage $V_{ALT}$ at approximately maximum voltage $V_{MAX}$. In FIG. 4, the second mode is shown between times $t_1$ and $t_2$, between times $t_3$ and $t_4$, and from time $t_5$ on. Accordingly, in the maintenance mode, control circuit 20 may disable second switched-mode power supply 34 responsive to a voltage (e.g., alternate voltage $V_{ALT}$) of second capacitor 38 being below a threshold charge (e.g., maximum voltage $V_{MAX}$), and may enable second switched-mode power supply 34 responsive to the voltage of second capacitor 38 being above the threshold charge.

In the third mode, switching elements 40a and 40b may be enabled, and second switched-mode power supply 34 may be disabled, such that second capacitor 38 transfers stored electrical energy to first capacitor 36, supplementing electrical energy provided from first switched-mode power supply 32 to first capacitor 36. Accordingly, an input current of first switched-mode power supply 32 may be limited, and if additional energy is needed on first capacitor 36 beyond that available from the current-limited first switched-mode power supply 32, such energy may be transferred from second capacitor 38 to first capacitor 36 in the third mode. In FIG. 4, the third mode is shown between times $t_2$ and $t_3$ and between times $t_4$ and $t_5$. Due to this current limiting, operation of system 30, and in particular switching elements 40a and 40b, may be dependent upon a condition of the input current of first switched-mode power supply 32 (e.g., control circuit 20 may enable switching elements 40a and 40b when the input current has reached the current limit). Stated another way, control circuit 20 may enable switching elements 40 responsive to a signal indicative of a need for increased energy on first capacitor 36, while control circuit 20 may disable switching elements 40 responsive to the signal indicative of the need for increased energy indicating no need for increased energy and a first voltage of the first storage capacitor being approximately equal to a second voltage of the second storage capacitor.

In the fourth mode, switching elements 40a and 40b may be enabled, and first switched-mode power supply 32 and second switched-mode power supply 34 may be alternately enabled in a phase-interleaved manner, such that first switched-mode power supply 32 and second switched-mode power supply 34 alternatingly transfer energy from their respective batteries to both of first capacitor 36 and second capacitor 38, thus increasing load voltage $V_{LOAD}$ and alternate voltage $V_{ALT}$.

Accordingly, using this plurality of modes of operation, system 30 may allow for limited input current to first switched-mode power supply 32 (and/or limited input current to first switched-mode power supply 324) while still allowing for Class-H operation of system 30 as a variable power supply to amplifier 16 in which a voltage on first capacitor 36 (e.g., load voltage $V_{LOAD}$) may vary based on a requirement for load voltage $V_{LOAD}$, which may be generated as a supply voltage, wherein the supply voltage is based on an output voltage (e.g., output voltage $V_{OUT}$) generated by a circuit (e.g., amplifier 16) using the supply voltage to generate the output voltage. In some embodiments, switching elements 40a and 40b may be activated for operation in the third mode when such supply voltage (e.g., load voltage $V_{LOAD}$) rises to a threshold voltage. In some of such embodiments, such threshold may be when load voltage $V_{LOAD}$ is approximately equal to alternate voltage $V_{ALT}$.

Although FIG. 3 depicts system 30 with one circuit topology that may be used in accordance with embodiments of the present disclosure, many other equivalent or approximately equivalent topologies may be used to achieve identical or substantially similar functionality, as shown in FIGS. 5-8 and described in greater detail below.

Figure 5:
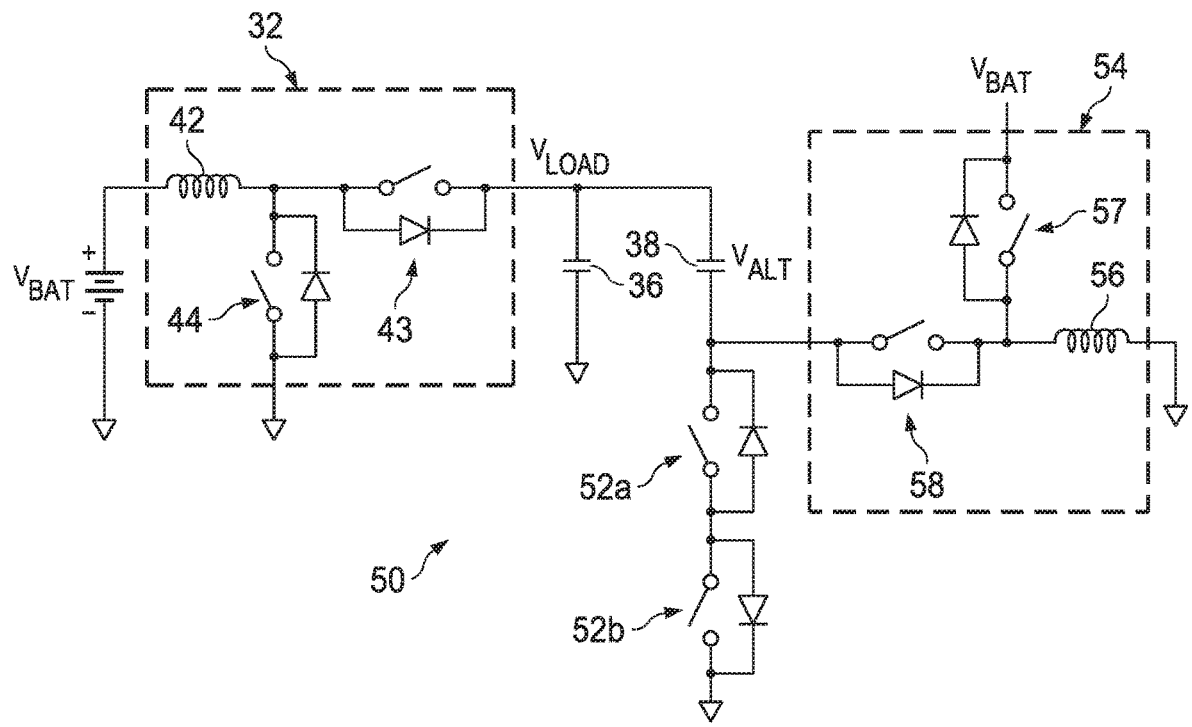
FIG. 5 is a block diagram of selected components of another example system for generating a boosted voltage, in accordance with embodiments of the present disclosure.

FIG. 5 is a block diagram of selected components of another example system 50 for generating a boosted voltage, in accordance with embodiments of the present disclosure. In some embodiments, example system 50 may be used to implement variable power supply 28 of FIG. 2. Example system 50 shown in FIG. 5 may be similar in many respects to example system 30 shown in FIG. 3, and thus, only the differences between example system 30 and example system 30 are discussed in detail. As shown in FIG. 5, system 50 may include battery 31, first switched-mode power supply 32, first capacitor 36 and second capacitor 38, similar to system 30. However, in lieu of switching elements 40a and 40b and second switched-mode power supply 34, system 50 may include switching elements 52a and 52b and second switched-mode power supply 54.

Second switched-mode power supply 54 may comprise a power inductor 56 and a plurality of switches 57 and 58. Power inductor 56 may comprise any passive two-terminal electrical component which resists changes in electrical current passing through it and such that when electrical current flowing through it changes, a time-varying magnetic field induces a voltage in power inductor 56, in accordance with Faraday's law of electromagnetic induction, which opposes the change in current that created the magnetic field. As shown in FIG. 5, power inductor 56 may be coupled between a negative input terminal of battery 31 at a first terminal of power inductor 56 and a switching node at a second terminal of power inductor 56 to which switches 57 and 58 are coupled.

Each switch 57 and 58 may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches 57 and 58 (e.g., control signals communicated from control circuit 20) are not depicted although such control signals would be present to selectively enable and disable switches 57 and 58. In some embodiments, a switch 57, 58 may comprise an n-type metal-oxide-semiconductor field-effect transistor.

Switch 57 may be coupled between the second terminal of power inductor 56 and a positive input terminal of battery 31 (e.g., battery voltage $V_{BAT}$). Switch 58 may be coupled between the second terminal of power inductor 56 and an output of second switched-mode power supply 54. In operation, switches 57 and 58 may be controlled by control circuit 20 such that second switched-mode power supply 54 operates as a buck-boost converter. For example, control circuit 20 may sequentially commutate switches 57 and 58 in a charging phase and discharging phase, respectively, in order to operate as a boost converter.

Second capacitor 38 may be coupled at its first terminal to the first terminal of first capacitor 36, and the output of second switched-mode power converter 54 may be coupled to the second terminal of second capacitor 38.

Each switching element 52a and 52b may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switching elements 52a and 52b (e.g., control signals communicated from control circuit 20) are not depicted although such control signals would be present to selectively enable and disable switching elements 52a and 52b. In some embodiments, a switching element 52a, 52b may comprise an n-type metal-oxide-semiconductor field-effect transistor. In these and other embodiments, switching elements 52a and 52b may have opposing body diodes (e.g., cathodes of such body diodes are electrically-coupled together). In these and other embodiments, switching elements 52a and 52b may be controlled to be enabled and disabled together, thus effectively acting as a single switch.

In addition, although FIG. 5 depicts second switched-mode power supply 54 receiving energy from the same battery 31 as first switched-mode power supply 32, in some embodiments, a different battery or power source may provide electrical energy to second-switched mode power supply 54.

One notable difference between system 30 and system 50 is that in system 50, second switched-mode power supply 54 is in an inverting configuration in order to output a negative voltage on the second terminal of second capacitor 38. Thus, the first modes of system 30 and system 50 operate in a similar manner. However, in the second mode of system 50, control circuit 20 may disable switching elements 52a and 52b and switched-mode power converter 54 may be enabled to maintain a voltage at its output so as to maintain alternate voltage $V_{ALT}$ at a particular voltage (e.g., maximum voltage $V_{MAX}$). Further, in the third mode of system 50, control circuit 20 may enable switching elements 52a and 52b (creating a path to ground between the second terminal of second capacitor 38 and ground) and switched-mode power converter 54 may be disabled. Because the voltage $V_{ALT}$ cannot, when switching between the second mode and the third mode, experience an instantaneous discontinuous change in voltage, the enablement of switching elements 52a and 52b in the third mode (as well as the first mode) serves to effectively couple second capacitor 38 to first capacitor 36, while the disablement of switching elements 52a and 52b in the second mode serves to effectively decouple second capacitor 38 from first capacitor 36.

Figure 6:
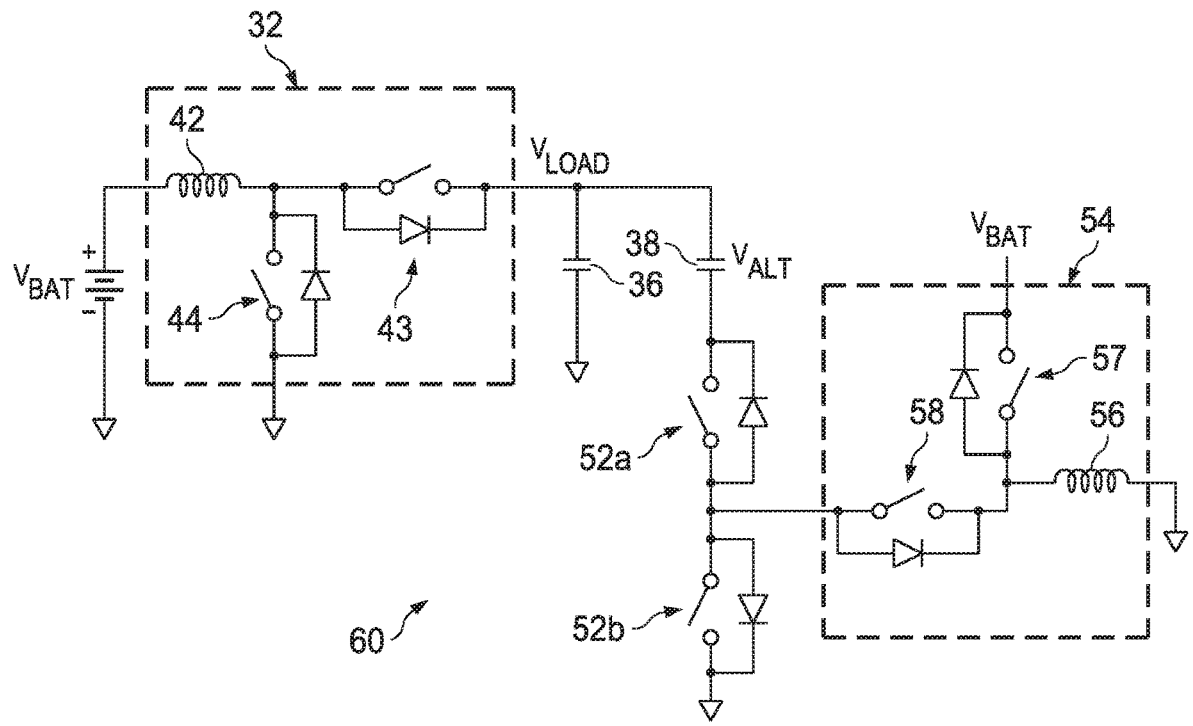
FIG. 6 is a block diagram of selected components of another example system for generating a boosted voltage, in accordance with embodiments of the present disclosure.

FIG. 6 is a block diagram of selected components of another example system 60 for generating a boosted voltage, in accordance with embodiments of the present disclosure. In some embodiments, example system 60 may be used to implement variable power supply 28 of FIG. 2. Example system 60 shown in FIG. 6 may be similar in many respects to example system 50 shown in FIG. 5, with the key difference being that rather than the output of second switched-mode power supply 54 being coupled between the second terminal of capacitor 38 and switching element 52a, the output of second switched-mode power supply 54 is instead coupled between switching elements 52a and 52b. However, in all material respects, system 60 of FIG. 6 operates identically to system 50 of FIG. 5.

Figure 7:
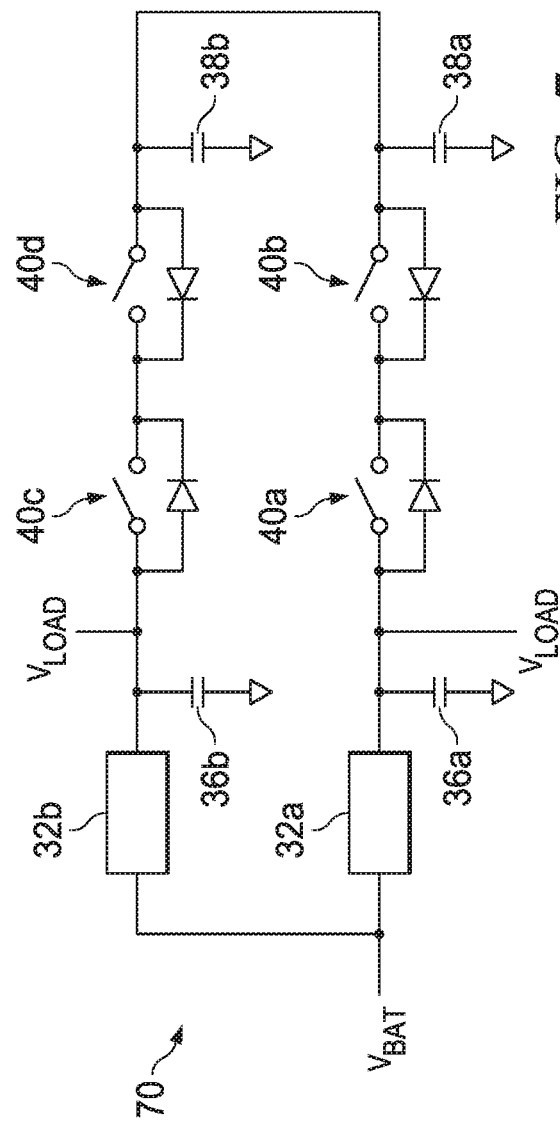
FIG. 7 is a block diagram of selected components of another example system for generating a boosted voltage, in accordance with embodiments of the present disclosure.

FIG. 7 is a block diagram of selected components of another example system 70 for generating a boosted voltage, in accordance with embodiments of the present disclosure. In some embodiments, example system 70 may be used to implement variable power supply 28 of FIG. 2. As shown in FIG. 7, system 70 may include a plurality of switched-mode power supplies 32 (e.g., switched-mode power supplies 32a and 32b), a plurality of capacitors 36 (e.g., capacitors 36a and 36b), one or more capacitors 38 (e.g., capacitors 38a and 38b), and a plurality of switching elements 40 (e.g., switching elements 40a, 40b, 40c, and 40d). In general, switched-mode power supplies 32 may be identical or similar to first switched-mode power supply 32 of FIG. 3, capacitors 36 may be identical or similar to capacitor 36 of FIG. 3, capacitors 38 may be identical or similar to capacitor 38 of FIG. 3, and switching elements 40 may be identical or similar to switching elements 40 of FIG. 3.

In operation, each switched-mode power supply 32 may be an independent envelope-tracking voltage supply (e.g., for a class-H amplifier). However, if, during operation, a switched-mode power supply 32 needs to provide more energy to its corresponding capacitor 36 beyond that available from the switched-mode power supply 32, control circuit 20 may enable switching elements 40 corresponding to the switched-mode power supply 32 so that the one or more capacitors 38 are able to transfer energy to the capacitor 36 corresponding to the switched-mode power supply 32. In addition, control circuit 20 may designate one switched-mode power supply 32 to be in charge of boost compensation to ensure that capacitors 38 are fully charged at any given time.

For purposes of clarity and exposition, FIG. 7 depicts two switched-mode power supplies 32, two capacitors 36, two capacitors 38, and four switching elements 40. However, system 70 may include any suitable number of such components. For example, in some embodiments, system 70 may include more than two switched-mode power supplies 32. As another example, in some embodiments, system 70 may include only one capacitor 38.

In operation, each independent switched-mode power supply 32 may operate in a plurality of modes comprising at least a first mode, a second mode, and a third mode. In the first mode, the switched-mode power supply 32 may be enabled to operate as a boost converter, and its corresponding switching elements 40 (e.g., switching elements 40a and 40b correspond to switched-mode power supply 32a, switching elements 40c and 40d correspond to switched-mode power supply 32b) may also be enabled such that the switched-mode power supply 32 charges its corresponding capacitor 36 and capacitor(s) 38. In the second mode, switched-mode power supply 32 may be enabled to operate as a boost converter, and its corresponding switching elements 40 may be disabled so long as switched-mode power supply 32 can provide the necessary power to its corresponding capacitor 36 within its input current limit. When the needed power exceeds the input current limit of the switched-mode power supply 32, its corresponding switching elements 40 may be enabled such that some of the needed power may be supplied from capacitor(s) 38. Operation may return to the first mode of operation when needed power is less than the maximum that can be supplied by the switched-mode power supply 32, such that capacitor(s) 38 may be recharged to its maximum voltage (e.g., maximum voltage $V_{MAX}$). In system 70, the various switched-mode power supplies 32 may simultaneously operate in the same mode or in different modes (e.g., switched-mode power supply 32a may operate in the third mode while switched-mode power supply 32b operates in the second mode, and vice versa).

Figure 8:
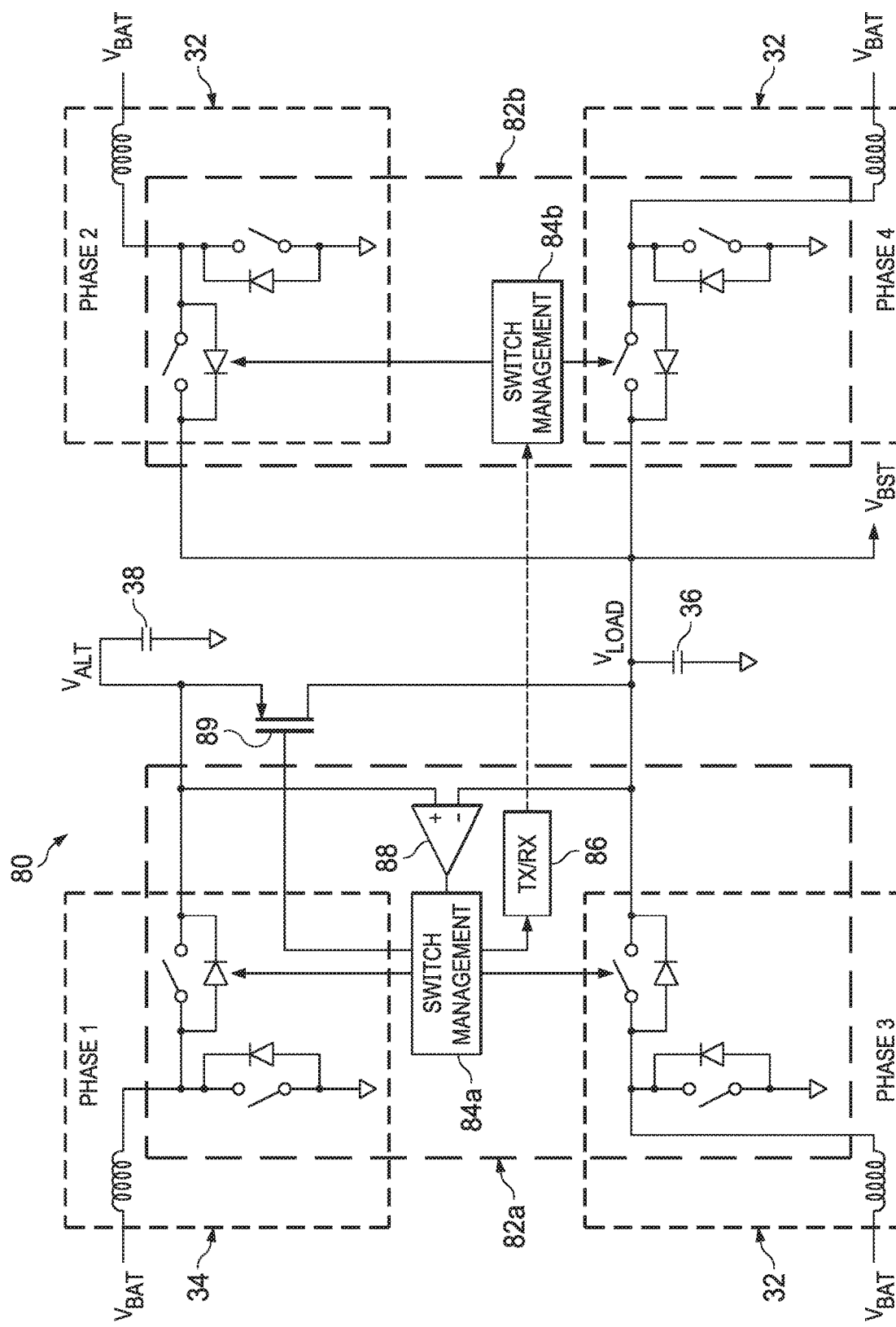
FIG. 8 is a block diagram of selected components of another example system for generating a boosted voltage, in accordance with embodiments of the present disclosure.

FIG. 8 is a block diagram of selected components of another example system 80 for generating a boosted voltage, in accordance with embodiments of the present disclosure. In some embodiments, example system 80 may be used to implement variable power supply 28 of FIG. 2. System 80 comprises a multiphase phase-interleaved converter implemented on one or more integrated circuits 82 (e.g., integrated circuits 82a and 82b) each having one or more boost converters implemented thereon. In FIG. 8, one of the boost converters of the multiphase phase-interleaved converter of system 80 may be functionally equivalent to second switched-mode converter 34 of system 30 of FIG. 3, and is thus labeled as "34" in FIG. 8. The other boost converters of the multiphase phase-interleaved converter of system 80 may be functionally equivalent to first switched-mode converter 32 of system 30 of FIG. 3, and are thus labeled as "32" in FIG. 8. Capacitors 36 and 38 depicted in system 80 of FIG. 8 may be functionally equivalent to capacitors 36 and 38 of system 30, respectively.

In operation, a switch management block 84a of integrated circuit 82a may, based on monitoring of load voltage $V_{LOAD}$ and alternative voltage $V_{ALT}$ by comparator 88, control switches of boost converters implemented on integrated circuit 82a, control a switch 89 coupled between capacitor 36 and capacitor 38, and communicate via a transceiver 86 control signals to switch management block 84b of integrated circuit 82b for controlling switches of boost converters implemented on integrated circuit 82b, such that system 80 operates among a plurality of modes in a manner similar to that of system 30 of FIG. 3. For instance, in a first mode of operation, switch 89 may be enabled, and second switched-mode power supply 34 may be disabled, such that first switched-mode power supplies 32 transfer energy from battery voltage $V_{BAT}$ to both of first capacitor 36 and second capacitor 38, thus increasing load voltage $V_{LOAD}$ and alternate voltage $V_{ALT}$. In a second mode, switch 89 may be disabled, such that first capacitor 36 and second capacitor 38 are decoupled from one another. Thus, in the second mode, first switched-mode power supplies 32 may transfer energy from battery voltage $V_{BAT}$ to first capacitor 36 to generate a desired load voltage $V_{LOAD}$. In addition, during the second mode, second switched-mode power supply 34 may be enabled and operate in maintenance mode, whereby it transfers energy from battery voltage $V_{BAT}$ to second capacitor 38 to maintain alternate voltage $V_{ALT}$ (e.g., at approximately maximum voltage $V_{MAX}$). In a third mode, switch 89 may be enabled, and second switched-mode power supply 34 may be disabled, such that second capacitor 38 transfers stored electrical energy to first capacitor 36, supplementing electrical energy provided from first switched-mode power supplies 32 to first capacitor 36. In a fourth mode of operation, switch 89 may be enabled, and all switched-mode power supplies 32 and 34 may be enabled sequentially in a phase-interleaved fashion, such that switched-mode power supplies 32 and 34 to transfer energy from battery voltage $V_{BAT}$ to both of first capacitor 36 and second capacitor 38, thus increasing load voltage $V_{LOAD}$ and alternate voltage $V_{ALT}$. Accordingly, input currents of first switched-mode power supplies 32 and 34 may be limited, and if additional energy is needed on first capacitor 36 beyond that available from the current-limited first switched-mode power supplies 32, such energy may be transferred from second capacitor 38 to first capacitor 36 in the third mode.

Also, system 30 and system 80 described above may also be considered systems that each operate as phase-interleaved switched-mode power supplies in one of two operational modes: (a) a normal operational mode in which all phases of switched-mode power supplies 32 and 34 are sequentially operated in a phase-interleaved fashion and a bypass switch (e.g., switch 40 of system 30, switch 89 of system 80) is enabled allowing all switched-mode power supplies to charge both capacitors 36 and 38; and (b) a bypass/Class-H mode in which a system (e.g., system 30 or 80) sheds one of its phases (e.g., switched-mode power supply 34) such that the remaining phases operate in a phase-interleaved fashion to charge first capacitor 36, a bypass switch (e.g., switch 40 or switch 89) is disabled, and the phase which is shed (e.g., switched-mode power supply 34) maintains second capacitor 38 at a pre-determined voltage (e.g., maximum voltage $V_{MAX}$ described above). While in the bypass/Class-H mode, a system (e.g., system 30 or 80) may occasionally close its bypass switch (e.g., switch 40 or switch 89), such that second capacitor 38 transfers stored electrical energy to first capacitor 36, supplementing electrical energy provided from first switched-mode power supplies 32 to first capacitor 36.

Figure 9:
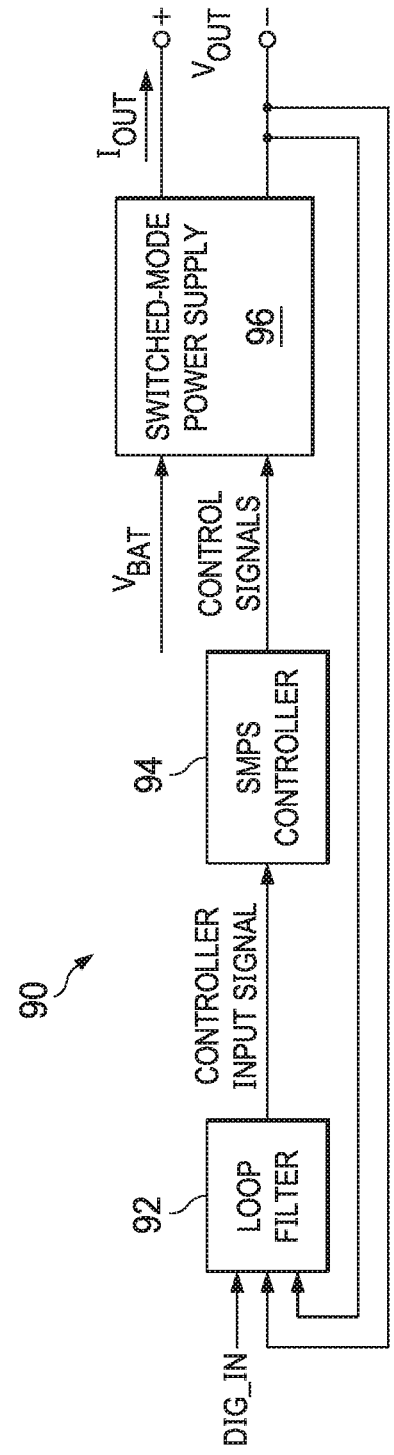
FIG. 9 is a block diagram of selected components of another example audio integrated circuit of a personal audio device, in accordance with embodiments of the present disclosure.

Although the foregoing discussion has contemplated that systems 30, 50, 60, 70, and 80 may each be used as a variable voltage supply to an audio amplifier for processing an audio signal, in some embodiments, one or more of systems 30, 50, 60, 70, and 80 may be used to generate an audio output signal within an amplifier, rather than supplying a supply voltage to such an amplifier for operation of the amplifier. For example, FIG. 9 is a block diagram of selected components of an example switched-mode amplifier 90, in accordance with embodiments of the present disclosure. In some embodiments, switched-mode amplifier 90 may be used in lieu of amplifier 16 described with respect to FIG. 2. As shown in FIG. 9, switched-mode amplifier 90 may comprise a loop filter 92, a switched-mode power supply controller 94, and a switched-mode power supply 96.

Loop filter 92 may comprise any system, device, or apparatus configured to receive an input signal (e.g., digital audio input signal DIG_IN or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to switched-mode power supply controller 94. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of switched-mode power supply 96.

Switched-mode power supply controller 94 may comprise any system, device, or apparatus configured to, based on the controller input signal, sequentially select among a plurality of switch configurations of switched-mode power supply 96 and based on an input signal (e.g., digital audio input signal DIG_IN), output signal $V_{OUT}$, and/or other characteristics of switched-mode amplifier 90, communicate a plurality of control signals to switched-mode power supply 96 to apply a switch configuration from a plurality of switch configurations of switches of switched-mode power supply 96 to selectively activate or deactivate each of the plurality of switches in order to transfer electrical energy from a battery or other power supply providing a voltage $V_{BAT}$ to the load of switched-mode amplifier 90 in accordance with the input signal.

Switched-mode power supply 96 may receive a voltage $V_{BAT}$ at its input, and may generate at its output audio output signal $V_{OUT}$. Although not explicitly shown in FIG. 9, in some embodiments, voltage $V_{BAT}$ may be received via input terminals including a positive input terminal and a negative input terminal which may be coupled to a ground voltage. Switched-mode power supply 96 may comprise a plurality of individual switched-mode power supplies with a plurality of switches that are controlled by control signals received from switched-mode power supply controller 94 in order to convert voltage $V_{BAT}$ to audio output signal $V_{OUT}$, such that audio output signal $V_{OUT}$ is a function of the input signal to loop filter 92. Switched-mode power supply 96 may be implemented by system 30, system 50, system 60, system 70, system 80, or any other suitable circuit.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
a first capacitor having a first capacitance;
a first switched-mode power supply configured to deliver electrical energy from a power source to the first capacitor at an output load of the first switched-mode power supply;
a second capacitor having a second capacitance larger than the first capacitance;
a second switched-mode power supply configured to deliver electrical energy from the power source or a second power source to the second capacitor; and
one or more switching elements coupled between the first capacitor and the second capacitor;
wherein the system is configured to operate in a plurality of modes, including:
a first mode in which the one or more switching elements are enabled, and at least one of the first switched-mode power supply or the second switched-mode power supply transfers energy to the load; and
a second mode in which the one or more switching elements are disabled, the first switched-mode power supply transfers energy to the load, the second switched-mode power supply transfers energy to the second capacitor, and a voltage at the load is lower than a voltage at the second capacitor.

2. The system of claim 1, wherein the second switched-mode power supply is configured to maintain a voltage of the second capacitor during the second mode.

3. The system of claim 1, wherein operation of the one or more switching elements is dependent upon a condition of an input current of the first switched-mode power supply.

4. The system of claim 1, wherein the first switched-mode power supply is configured to operate in a mode in which an input current of the first switched-mode power supply is limited.

5. The system of claim 1, wherein the second capacitor is configured to be decoupled from the first capacitor by the one or more switching elements by disabling a path between one terminal of the second capacitor and an electrical ground.

6. The system of claim 1, wherein the first switched-mode power supply is configured to generate a supply voltage to the output load, wherein the supply voltage is based on an output voltage generated by a circuit using the supply voltage to generate the output voltage.

7. The system of claim 6, wherein the one or more switching elements are enabled responsive to the supply voltage being above a threshold voltage.

8. The system of claim 7, wherein the threshold voltage is defined when a first voltage of the first capacitor is approximately equal to a second voltage of the second capacitor.

9. The system of claim 1, wherein:
the one or more switching elements are controlled responsive to a signal indicative of a need for increased energy at the output load; and
responsive to the signal indicative of the need for increased energy indicating no need for increased energy and a first voltage of the first capacitor being approximately equal to a second voltage of the second capacitor, the one or more switching elements are disabled.

10. The system of claim 1, wherein the first switched-mode power supply is a phase interleaved boost converter and the output load is common to all outputs of the phase interleaved boost converter.

11. The system of claim 1, wherein the second switched-mode power supply comprises one or more independent switched-mode power supplies operating on the second capacitor.

12. The system of claim 1, wherein the second switched-mode power supply is disabled responsive to a voltage of the second capacitor being above a threshold voltage.

13. The system of claim 1, wherein the second switched-mode power supply is enabled responsive to a voltage of the second capacitor being below a threshold voltage.

14. The system of claim 1, wherein the first switched-mode power supply and the second switched-mode power supply are individual phases of a multi-phase converter, wherein one phase of the individual phases is isolated in order to maintain charge on the second capacitor.

15. The system of claim 1, wherein the plurality of modes further includes a mode in which the second capacitor transfers energy to the first capacitor.

16. The system of claim 1, wherein in the third mode, the first switched-mode power supply and the second switched-mode power supply are configured to operate in a phase-interleaved fashion to transfer energy to the first capacitor and the second capacitor.

17. A method comprising, in a system comprising a first capacitor having a first capacitance, a first switched-mode power supply configured to deliver electrical energy from a power source to the first capacitor at an output load of the first switched-mode power supply, a second capacitor having a second capacitance larger than the first capacitance, and a second switched-mode power supply, the second switched-mode power supply configured to deliver electrical energy from the power source or a second power source to the second capacitor:

controlling one or more switching elements coupled between the first capacitor and the second capacitor; and
operating the system in a plurality of modes, including:
a first mode in which the one or more switching elements are enabled, and at least one of the first switched-mode power supply or the second switched-mode power supply transfers energy to the load;
a second mode in which the one or more switching elements are disabled, the first switched-mode power supply transfers energy to the load, the second switched-mode power supply transfers energy to the second capacitor, and a voltage at the load is lower than a voltage at the second capacitor.

18. The method of claim 17, further comprising maintaining a voltage of the second capacitor with the second switched-mode power supply during the second mode.

19. The method of claim 17, further comprising operating the one or more switching elements dependent upon a condition of an input current of the first switched-mode power supply.

20. The method of claim 17, further comprising operating the first switched-mode power supply in a mode in which an input current of the first switched-mode power supply is limited.

21. The method of claim 17, further comprising decoupling the second capacitor from the first capacitor by the one or more switching elements by disabling a path between one terminal of the second capacitor and an electrical ground.

22. The method of claim 17, further comprising generating, by the first switched-mode power supply, a supply voltage to the output load, wherein the supply voltage is based on an output voltage generated by a circuit using the supply voltage to generate the output voltage.

23. The method of claim 22, further comprising enabling the one or more switching elements responsive to the supply voltage being above a threshold voltage.

24. The method of claim 23, wherein the threshold voltage is defined when a first voltage of the first capacitor is approximately equal to a second voltage of the second capacitor.

25. The method of claim 17, further comprising:
controlling the one or more switching elements responsive to a signal indicative of a need for increased energy at the output load; and
responsive to the signal indicative of the need for increased energy indicating no need for increased energy and a first voltage of the first capacitor being approximately equal to a second voltage of the second capacitor, disabling the one or more switching elements.

26. The method of claim 17, wherein the first switched-mode power supply is a phase interleaved boost converter and the output load is common to all outputs of the phase interleaved boost converter.

27. The method of claim 17, wherein the second switched-mode power supply comprises one or more independent switched-mode power supplies operating on the second capacitor.

28. The method of claim 17, further comprising disabling the second switched-mode power supply responsive to a charge of the second capacitor being above a threshold charge.

29. The method of claim 17, further comprising disabling the one or more switching elements responsive to a charge of the second capacitor being below a threshold charge.

30. The method of claim 17, wherein the first switched-mode power supply and the second switched-mode power supply are individual phases of a multi-phase converter, wherein one phase of the individual phases is isolated in order to maintain charge on the second capacitor.

31. The method of claim 17, wherein the plurality of modes further includes a mode in which the second capacitor transfers energy to the first capacitor.

32. The method of claim 17, wherein in the third mode, the first switched-mode power supply and the second switched-mode power supply operate in a phase-interleaved fashion to transfer energy to the first capacitor and the second capacitor.

33. A system comprising:
a first capacitor having a first capacitance;
a second capacitor having a second capacitance larger than the first capacitance; and
a plurality of switched-mode power supplies configured to deliver electrical energy from one or more power sources to the first capacitor and the second capacitor in accordance with operation in a plurality of modes including:
a first mode of operation in which the plurality of switched-mode power supplies transfers electrical energy to the first capacitor and the second capacitor in a phase-interleaved fashion; and
a second mode of operation in which the first capacitor and the second capacitor are electrically decoupled from one another, one of the plurality of switched-mode power supplies transfers electrical energy to the second capacitor and the remainder of the plurality of switched-mode power supplies power transfer electrical energy to the first capacitor in a phase-interleaved fashion.

34. The system of claim 33, wherein the plurality of modes includes a third mode of operation in which the first capacitor and second capacitor are electrically coupled to one another, such that the second capacitor transfers stored electrical energy to the first capacitor, supplementing electrical energy provided to the first capacitor from the remainder of the plurality of switched-mode power supplies.

35. A method comprising, in a system comprising a first capacitor having a first capacitance, a second capacitor having a second capacitance larger than the first capacitance, and a plurality of switched-mode power supplies configured to deliver electrical energy from one or more power sources to the first capacitor and the second capacitor, operating the system in a plurality of modes including:
a first mode of operation in which the plurality of switched-mode power supplies transfers electrical energy to the first capacitor and the second capacitor in a phase-interleaved fashion; and
a second mode of operation in which the first capacitor and the second capacitor are electrically decoupled from one another, one of the plurality of switched-mode power supplies transfers electrical energy to the second capacitor and the remainder of the plurality of switched-mode power supplies power transfer electrical energy to the first capacitor in a phase-interleaved fashion.

36. The method of claim 35, wherein the plurality of modes includes a third mode of operation in which the first capacitor and second capacitor are electrically coupled to one another, such that the second capacitor transfers stored electrical energy to the first capacitor, supplementing electrical energy provided to the first capacitor from the remainder of the plurality of switched-mode power supplies.

* * * * *